(12) United States Patent  
Li et al.

(10) Patent No.: US 7,763,499 B2
(45) Date of Patent: Jul. 27, 2010

(54) CMOS FRONT END PROCESS COMPATIBLE LOW STRESS LIGHT SHIELD

(75) Inventors: Jiutao Li, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 12/149,807

(22) Filed: May 8, 2008

(65) Prior Publication Data

US 2008/0230861 A1  Sep. 25, 2008

Related U.S. Application Data

(63) Continuation of application No. 10/893,293, filed on Jul. 19, 2004, now Pat. No. 7,385,167.

(51) Int. Cl.
*H01L 21/00* (2006.01)
(52) U.S. Cl. .................. 438/116; 438/29; 438/69; 438/72; 257/59; 257/72; 257/291; 257/E21.053; 257/E21.527; 257/E21.585
(58) Field of Classification Search ................ 438/116, 438/141, 328; 257/E21.053, E21.352, E21.527
See application file for complete search history.

(56) References Cited

U.S. PATENT DOCUMENTS

| 5,448,097 | A | 9/1995 | Mizushima et al. |
|---|---|---|---|
| 5,629,517 | A | 5/1997 | Jackson et al. |
| 5,708,264 | A | 1/1998 | Hawkins et al. |
| 6,057,586 | A | 5/2000 | Bawolek et al. |
| 6,429,470 | B1 | 8/2002 | Rhodes |
| 6,469,317 | B1 | 10/2002 | Yamazaki et al. |
| 6,587,288 | B2 | 7/2003 | Erz et al. |
| 6,611,013 | B2 | 8/2003 | Rhodes |
| 7,030,918 | B1 * | 4/2006 | Nakashiba ............... 348/294 |
| 2003/0127647 | A1 | 7/2003 | Street et al. |

\* cited by examiner

*Primary Examiner*—Charles D Garber
*Assistant Examiner*—Cheung Lee
(74) *Attorney, Agent, or Firm*—Dickstein Shapiro LLP

(57) ABSTRACT

An improved imaging device having a pixel arrangement featuring a multilayer light shield. The multilayer light shield includes stacked layers of light-shielding and light-transparent material. The light-transparent material, such as a dielectric, is selected to have a stress, such as a tensile stress, that offsets the stress, such as a compressive stress, of the light shielding material. Without the stress offset, the high compressive stress of the refractory metal could damage the integrity of the nearby silicon. The refractory metal is capable of withstanding the high temperatures associated with front end CMOS processing. The laminate structure allows the light shield to be placed close to the pixel surface. The light-transparent material has a thickness equal to about one-quarter wavelength of the light to be blocked, to act as an anti-reflective coating. An aperture in the light shield exposes the active region of the pixel's photoconversion device.

19 Claims, 17 Drawing Sheets

CMOS FRONT END PROCESS COMPATIBLE LOW STRESS LIGHT SHIELD

CROSS REFERENCE TO RELATED APPLICATIONS

This application is a continuation of U.S. application Ser. No. 10/893,293, filed Jul. 19, 2004 now U.S. Pat. No. 7,385,167, which is hereby incorporated by reference in its entirety.

FIELD OF THE INVENTION

The invention relates to multilayer light shields for semiconductor-based photoimaging devices and to methods of forming and using the light shields.

BACKGROUND

A semiconductor photoimaging device includes a focal plane array of pixel cells supported by a substrate. Each of the pixel cells includes a photoconversion device, for example, a photogate, a photoconductor, or a photodiode, for generating and accumulating photo-generated charge in a portion of the substrate. A readout circuit is connected to each pixel cell and typically includes at least an output transistor, which receives photogenerated charges from a doped diffusion region and produces an output signal that is periodically read-out through a pixel access transistor. The imager may optionally include a transistor for transferring charge from the photoconversion device to the diffusion region or the diffusion region may be directly connected to, or be part of, the photoconversion device. A transistor is also typically provided for resetting the diffusion region to a predetermined charge level before it receives the photo-converted charges. A CMOS imager circuit is often associated with a color filter, such as a Bayer filter, for discerning various wavelengths of light.

One typical CMOS imager pixel circuit, the three-transistor (3T) pixel, contains a photodiode for supplying photo-generated charge to a diffusion region; a reset transistor for resetting the diffusion region; a source follower transistor having a gate connected to the diffusion region, for producing an output signal; and a row select transistor for selectively connecting the source follower transistor to a column line of a pixel array. Another typical CMOS imager pixel employs a four-transistor (4T) configuration, which is similar to the 3T configuration, but utilizes a transfer transistor to gate charges from the photodiode to the diffusion region and the source follower transistor for output.

Exemplary CMOS imaging circuits, processing steps thereof, and detailed descriptions of the functions of various CMOS elements of an imaging circuit are described, for example, in U.S. Pat. No. 6,140,630, U.S. Pat. No. 6,376,868, U.S. Pat. No. 6,310,366, U.S. Pat. No. 6,326,652, U.S. Pat. No. 6,204,524, and U.S. Pat. No. 6,333,205, each of which is assigned to Micron Technology, Inc., the entire disclosures of which are incorporated herein by reference.

Typical imaging devices have a light shield providing apertures exposing at least a portion of the photoconversion devices to incoming light while shielding the remainder of the pixel circuit and neighboring pixels from the light. Light shields separate received light signals of adjacent pixels, known as crosstalk, and prevent photocurrent from being generated in undesirable locations in the pixel. As a result, the imaging device can achieve higher spatial resolution and color affinity with less blooming, blurring, and other detrimental effects. Light shields can also serve to protect the circuitry associated with the pixels from radiation damage, for example.

In the prior art, light shields have typically been formed in the metal interconnect layering (e.g., the Metal 1 (M1), Metal 2 (M2), or, if utilized, Metal 3 (M3) layers) of the integrated circuit. Metallization layer light shield structures have some drawbacks, such as limiting use of the metal layer to the light shield rather than for its normal conductive interconnect purpose. Additionally, having the light shield in upper metallization (conductive interconnect) layers, spaced some 18,000 Å from the photo-sensitive area, can increase crosstalk, light piping, and light shadowing in the pixels, which can cause errors.

To satisfy optical performance specifications, light masks need to exhibit good light absorption, low reflectivity (higher reflectivity might induce light back scattering) and be as close as possible to the pixel surface to minimize light scattering to vicinal pixels. Metal layers in CMOS imaging devices normally provide this function. Metal layers also serve as conductors. An example of a metal light shield formed on an insulator above the pixel surface is provided in U.S. Pat. No. 6,611,013, assigned to Micron Technology, Inc., and U.S. application Ser. No. 10/410,191 filed Apr. 10, 2003 in the name of Rhodes, the entire disclosures of which are incorporated herein by reference.

Performance objectives become more difficult to satisfy as device sizes become smaller. Widths of metal lines used as light masks also become smaller, down to equal to or less than the wavelength of the light being detected. Additionally, objects at sub-wavelength sizes exhibit a great deal of scattering. Consequently, the need to locate the light shield closer to the pixel surface increases with advancing miniaturization. As light shields are located closer to the pixel surface, however, the light shield layers are exposed to more manufacturing steps and hence are subjected to greater temperatures.

Light shields that can be located close to the pixel surface are needed. The light shields must have good thermal stability, be able to withstand the rigors of "front end" CMOS processing, and be compatible with adjacent structures in the pixel.

SUMMARY

The present invention provides a multilayer stack of light shielding materials and dielectrics. An exemplary light shielding material is a refractory metal that can withstand the high temperatures of front end CMOS processing. Refractory metals have high compressive stress, and putting high stress refractory metal layers close to silicon introduces additional stress on adjacent silicon, for example, and can increase leakage, cause contamination of the photodiode layer, and increase dark current. According to the present invention, transparent layers of materials having high tensile stress are interleaved with the refractory metal layers. The high tensile strength layers offset the high compressive stress of the refractory metal layers to prevent damage to silicon, for example, by adjacent refractory metal layers.

The invention also relates to methods for forming the multilayer light shield and an imaging device incorporating the shield. The light shield and method of forming of the invention are particularly well suited for CMOS imaging devices.

BRIEF DESCRIPTION OF THE DRAWINGS

The above-described features and advantages of the invention will be more clearly understood from the following detailed description, which is provided with reference to the accompanying drawings in which.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions, junctions, or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit containing a photoconversion device and transistors for converting electromagnetic radiation to an electrical signal. The pixels discussed herein are illustrated and described as 4T pixel circuits for the sake of example only. It should be understood that the invention is not limited to a four transistor (4T) pixel, but may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imaging device. In addition, although the invention is described below with reference to a CMOS imager, the invention has applicability to any solid state imaging device having pixels. The following detailed description is, therefore, not to be taken in a limiting sense, and the scope of the present invention is defined only by the appended claims.

Figure 1:
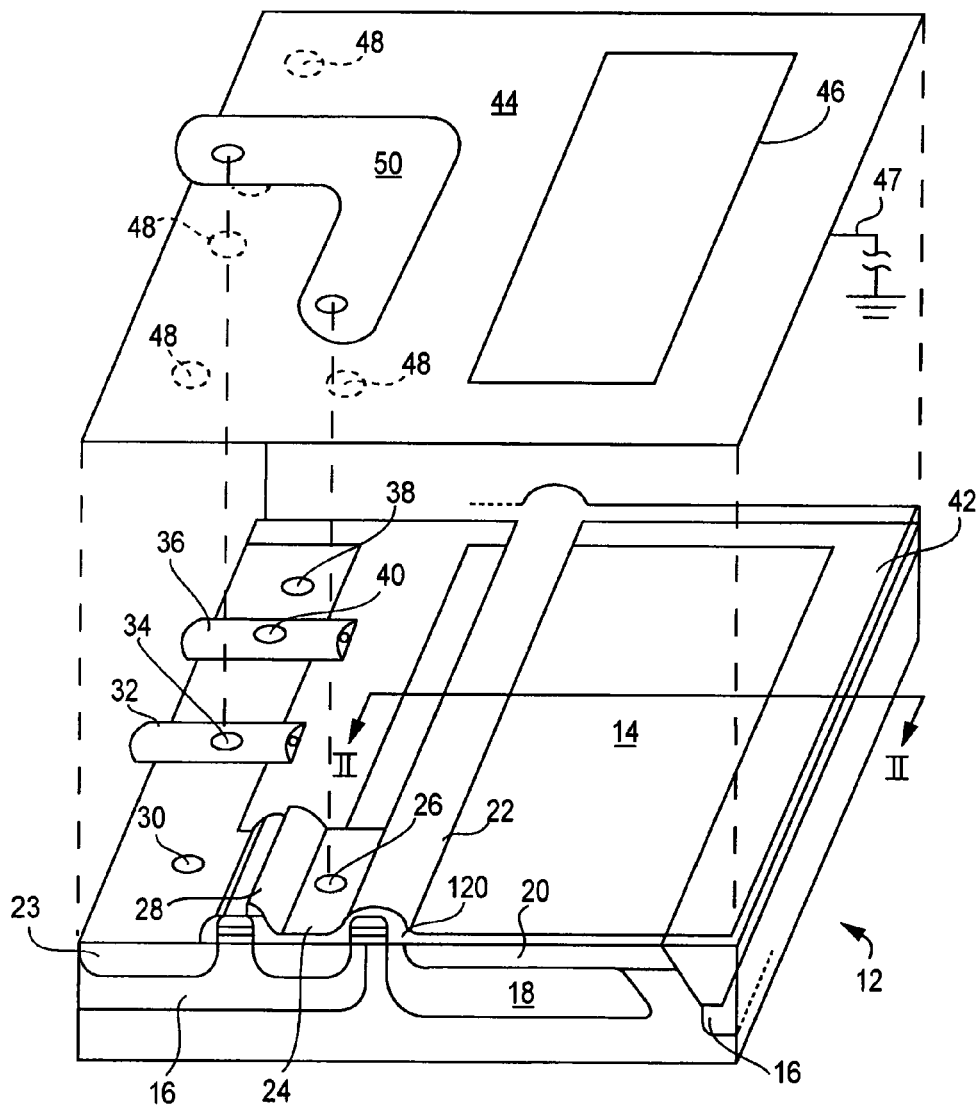
FIG. 1 is an exploded view of an exemplary pixel according to the invention.
Figure 2:
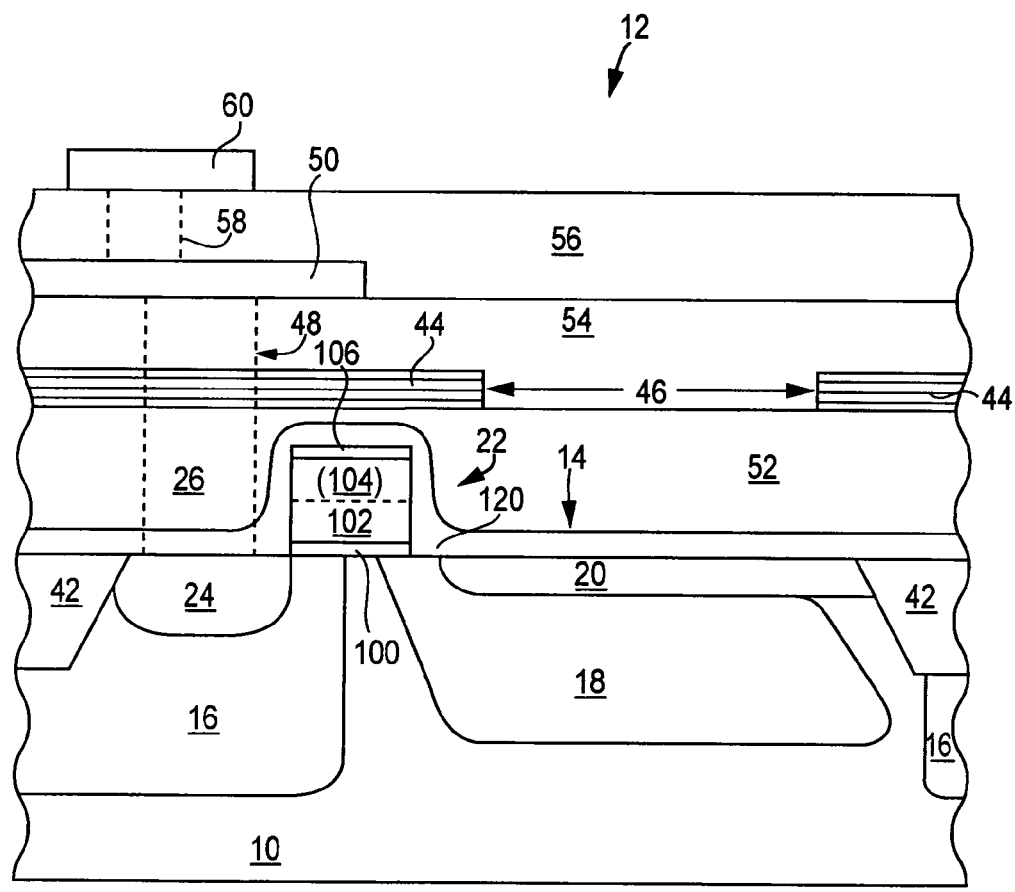
FIG. 2 is a partial cross-sectional view of the pixel of FIG. 1 taken along the line II-II.

Referring to the drawings, where like reference numbers designate like elements, FIGS. 1 and 2 show an exemplary embodiment of the invention used in connection with a four transistor (4T) CMOS pixel 12 having a photodiode 14 as a photoconversion device. The photodiode 14 is formed in a p-type substrate 10, and includes an n-type conductivity region 18 and an uppermost thin p-type conductivity layer 20 over the n-type region 18. It should be understood that while FIGS. 1 and 2 show the circuitry for a single pixel 12, in practical use there will be an M×N array of pixels 12 arranged in rows and columns with the pixels 12 of the array being accessed using row and column select circuitry, as is known in the art. The pixel 12 shown can be laterally isolated from other pixels of the array by shallow trench isolation regions 42. Although the isolation region 42 is shown only along two sides of the pixel 12 for simplicity, in practice trench isolation regions may extend around the entire perimeter of the pixel 12.

The 4T CMOS pixel 12 shown in FIGS. 1 and 2 is formed partially in and over a doped p-type region 16 in the substrate 10, and includes a transfer gate 22, a reset gate 28, a source follower gate 32, and a row select gate 36. The transfer gate 22 forms part of a transfer transistor for electrically gating the charges accumulated by the photodiode 14 to a floating diffusion region 24. A first conductor 26 at the floating diffusion region 24 is in electrical communication with the gate 32 of the source follower transistor through a second conductor 34. The two conductors 26, 34 are electrically connected via a conductive path 50 in a conductive interconnect layer, e.g., the M1 metal layer. Sharing the floating diffusion region 24 with the transfer transistor is reset transistor having the reset gate 28. The reset transistor is connected to a voltage source ($V_{dd}$) through a source/drain region having a conductor 30 for providing a resetting voltage to the floating diffusion region 24.

Figure 20:
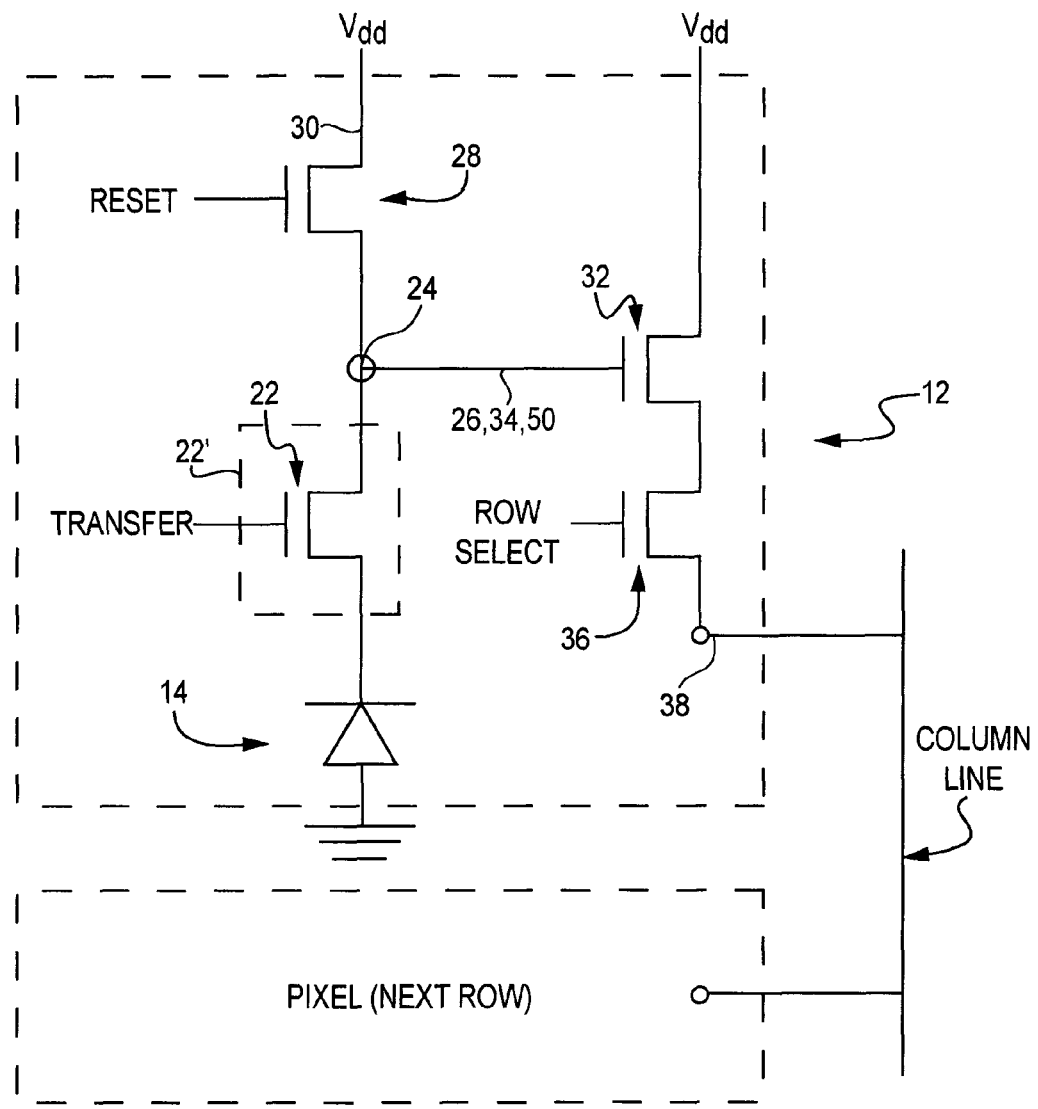
FIG. 20 shows circuit diagram of a 4T pixel like that shown in FIG. 1.

An electrical equivalent circuit for the FIG. 1 pixel is illustrated in FIG. 20 with pixel 12 being operated as known in the art by RESET, TRANSFER, and ROW SELECT control signals. As shown in FIG. 20, the 4T pixel circuit can be converted to a 3T pixel circuit by removing the portion contained within the dotted box 22', i.e., the transfer transistor, and electrically coupling the photodiode 14 output to the floating diffusion region 24, the floating diffusion region 24 being connected to the gate 32 of the source follower transistor.

Over the pixel 12 circuitry is a light shield 44, as shown in FIG. 1, which is an opaque multilayer configured to prevent light energy from irradiating the underlying circuitry and vicinal pixels. The multilayer light shield 44 includes at least one layer of a light-shielding material, such as tungsten (W), molybdenum (Mo), cobalt (Co), tantalum (Ta), chromium (Cr), titanium (Ti), carbon (C), tungsten silicide ($WSi_x$), titanium nitride (TiN), or other materials with the desired light-blocking, electrical, and physical characteristics. Of these, the refractory metals, particularly W, Ta, and Mo, are preferred. The light shield 44 can be very thin, and in particular must be able to withstand the temperatures (approximately 1,000° C.) experienced during front end CMOS processing. The light shield of the present invention can be located at least within 3,000 Å-4,000 Å of the pixel surface.

Figure 6:
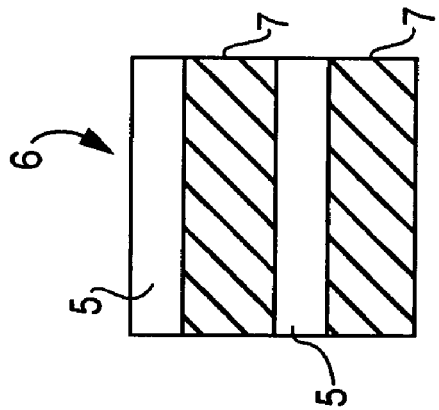
FIG. 6 is a cross-section of an exemplary multilayer tungsten-dielectric light shield stack according to the invention.
Figure 5:
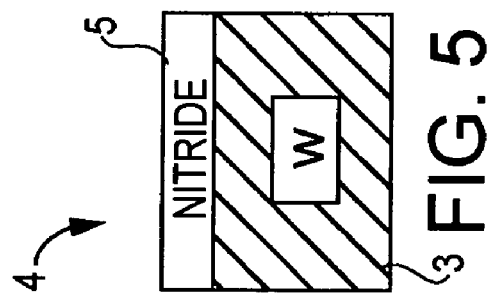
FIG. 5 is a cross-section of an exemplary two-layer tungsten-dielectric light shield stack according to the invention.
Figure 4:
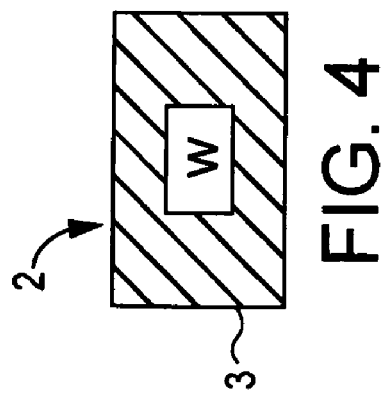
FIG. 4 is a cross-section of a single-layer tungsten light shield stack provided for comparative purposes.
Figure 8:
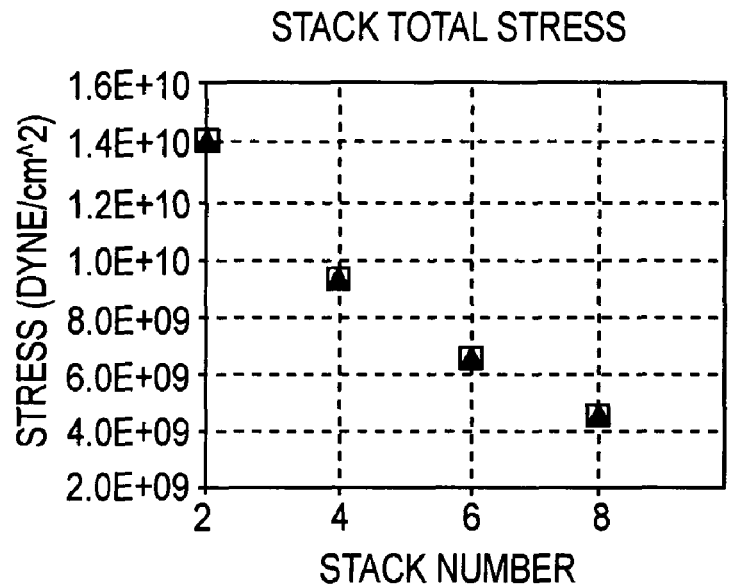
FIG. 8 is a graph illustrating the total stress in the stacks of FIGS. 4-7.

Referring to FIGS. 4-7, light shield structures 2, 4, 6, 8 are respectively illustrated schematically in cross-section. FIG. 8 is an associated graph depicting the total stack stress in each of the structures 2, 4, 6, 8. FIG. 4 illustrates a single layer light shield structure 2 shown for comparative purposes. Light shield structure 2 is a single layer 3 of tungsten (W) about 1680 Å in thickness. As shown in FIG. 8, the compressive stress of tungsten is about $1.4E10$ dyne/cm$^2$. Referring to FIG. 5, the light shield stack 4 includes the 1680 Å layer of tungsten 3 and a layer of silicon nitride 5. Alternatively, silicon oxide can be used, but silicon nitride is preferred. Silicon nitride layer 5 has a thickness of about 600 Å. Silicon nitride exhibits tensile stress of about $4E9$ dyne/cm$^2$. The combination of tungsten layer 5 and silicon nitride layer 6 reduces the total stress in the stack structure 4, as illustrated in FIG. 8. Referring to FIG. 6, stack 6 includes two 840 Å layers 7 of tungsten and two 600 Å layers 5 of silicon nitride, and in FIG. 7 stack structure 8 includes three 560 Å layers 9 of tungsten and three 600 Å layers 5 of silicon nitride. As is evident from FIG. 8, the total stack stress varies inversely with the number of metal/dielectric layers in the multilayer light shield stack structure.

Figure 9:
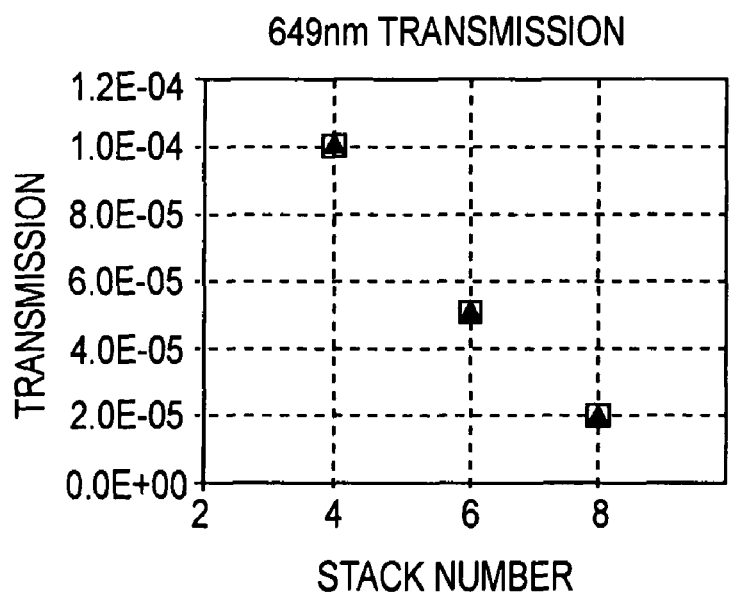
FIG. 9 is a graph of transmission data for the stacks of FIGS. 5-7.

Referring to FIG. 9, in addition to reduced stress, stack structures 4, 6, 8 exhibit improved light shielding. FIG. 9 is a graph illustrating transmission of red light (649 nm wavelength) through each of the stacks 4, 6, 8. As can be seen from the plots in FIG. 9, stacks 4, 6, 8 exhibit increasing ability to block red light in direct relation to the number of layers in the stack, even though the combined thickness of the tungsten layers is the same in each stack. As a result, the combined thickness of the tungsten layers, and the overall thickness of light shield can be reduced as compared to a single-layer light shield, while obtaining the same or better light-shielding properties.

Further improvements in light-handling properties of the multilayer light shield are obtained by forming the dielectric layers with a thickness equal to one-quarter wavelength of the light to be blocked. Where multiple colors are involved, an average of their wavelengths, for example, can be used. By separating the light-shielding layers by one-quarter wavelength of the light to be blocked, light waves reflected at the interface between the light shielding layers and the transparent dielectric will be off-set by one-half wavelength with respect to incoming light waves traveling through the light shield. The reflected light having a one-half wavelength offset will tend to cancel the incoming light waves, further adding to the light absorbing capabilities of the multilayer light shield.

Consequently, further reductions in thickness of the light-shielding layer are possible. For visible light, the dielectric layer will have a thickness between about 100 Å and about 1,000 Å. Thicknesses of about 600 Å or 700 Å are appropriate for red and green light.

Figure 3:
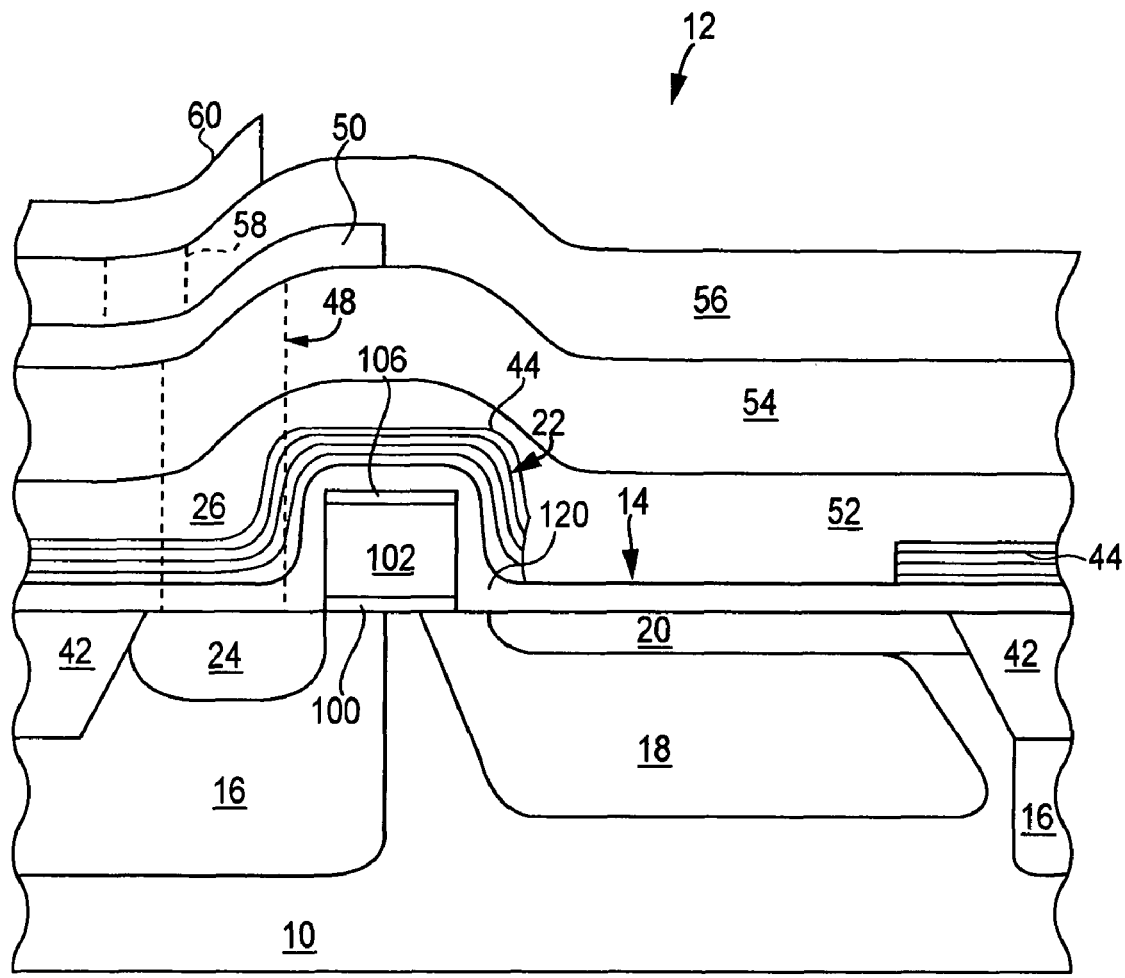
FIG. 3 is a partial cross-sectional view of an alternative embodiment of a pixel constructed in accordance with the invention.
Figure 7:
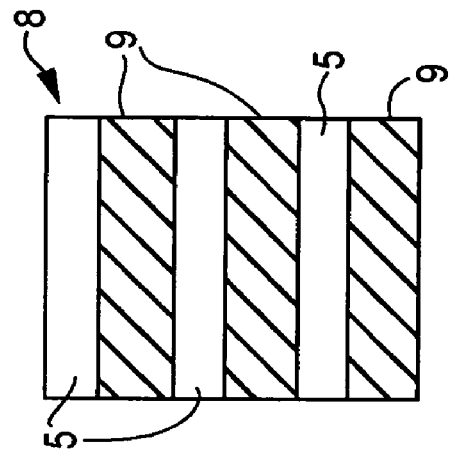
FIG. 7 is a cross-section of an exemplary multilayer tungsten-dielectric light shield stack according to the invention.

It is preferred that less than 0.01% of light impacting the light shield 44 penetrates to the underlying wafer. As shown in FIG. 2 and described in relation thereto, a transparent borophosphosilicate glass (BPSG) layer 52 can be positioned between the light shield 44 and the underlying pixel 12. As shown in FIG. 3, the light shield 44 can be a conformal layer formed directly on the photodiode 14 layer.

Again referring to FIG. 1, an M1 layer containing conductive interconnect pattern 54 is formed above the light shield 44, which is between the pixel transistors and the M1 layer 50. Optionally, the first conductive interconnect M1 layer 50 can be formed directly over the light shield 44 if the light shield 44 is not conductive.

The light shield 44 defines an aperture 46 over the photodiode 14 to allow light to pass. The light shield 44, if conductive, can also optionally be electrically grounded by a grounding circuit 47, by which it can provide electrical shielding to the underlying pixel circuitry. In another embodiment, the light shield 44 can be used for electrical strapping in the periphery. Additional openings 48 are provided in the light shield 44 to allow the various circuitry contacts 26, 30, 34, 38, 40 to be in electrical communication between overlying conductive interconnect layers 50, 60, such as M1, M2, etc., and underlying pixel circuitry, e.g., gates 22, 28, 32, 36.

FIGS. 2 and 3 show alternative cross sections of a portion of the FIG. 1 pixel 12 taken along the line II-II and with some additional detail. As is shown, a light transparent first dielectric layer 52 can be provided over the pixel 12 having an upper surface above the level of the transistor gates, e.g., gate 22, of the pixel 12. Light shield layer 44 is formed over the first dielectric layer 52 above the pixel 12. As shown by FIG. 3, this light shield 44, as well as the other layers of the pixel cell, can be conformally deposited. A second dielectric layer 54 having similar light transmitting and insulating properties as the first dielectric layer 52 can be formed over the light shield layer 44 (and within the aperture 46). Over this layer can be formed the first conductive interconnect layer 50, i.e., M1 layer, which may be connected by contacts (e.g., conductor 26) to the underlying circuitry provided in openings 48 through the various layers 44, 52, 54. Additional layering over the first conductive interconnect layer 50 is also shown in FIGS. 2 and 3, such as a third dielectric layer 56 having light transmitting and insulating properties similar to the other two dielectric layers 52 and 54. Over this second dielectric layer 56 can be formed a second conductive interconnect layer 60 (M2), which can be in electrical contact with the first conductive interconnect layer 50 (or other parts of the pixel 12 circuitry or imaging device) by conductors 58. Additional dielectric, conductive interconnect, or passivation layers can be formed over the second conductive interconnect layer 60, but are not shown for the sake of clarity. Pixel 12 devices as shown in FIGS. 1-3 can be formed as described below.

Figure 10:
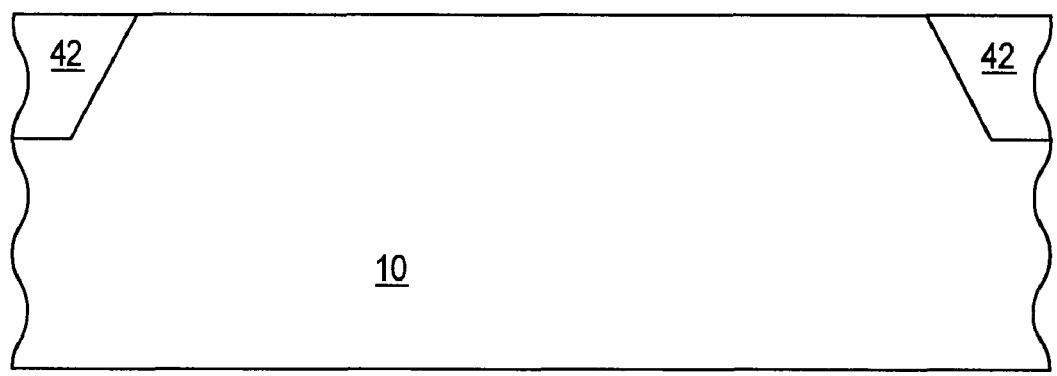
FIG. 10 shows a stage of fabrication of a circuit like that shown in FIGS. 1 and 2 in accordance with the invention.

FIG. 10 shows a preliminary stage of processing. As mentioned above in discussing FIG. 1, each pixel 12 is isolated within the substrate 10 by isolation regions 42, which are preferably STI (shallow trench isolation) regions, but may also be formed by LOCOS processing. FIG. 10 shows the formed STI isolation regions 42. The STI isolation regions 42 can be formed by using a photoresist mask, patterning, and etching to leave trenches where the isolation regions 42 are desired. The photoresist mask is removed, and a layer of dielectric material (e.g., silicon dioxide, silicon nitride, oxide-nitride, nitride-oxide, or oxide-nitride-oxide, etc.) is formed within the trenches by chemical vapor deposition (CVD), low pressure chemical vapor deposition (LPCVD), high density plasma (HDP) deposition, or other suitable means. After filling the trenches with the dielectric material, the wafer is planarized, for example by chemical mechanical polishing (CMP) or reactive ion etch (RIE) dry etching processes, and the isolation regions are complete as shown in FIG. 10 and surround the pixel 12 area.

Figure 11:
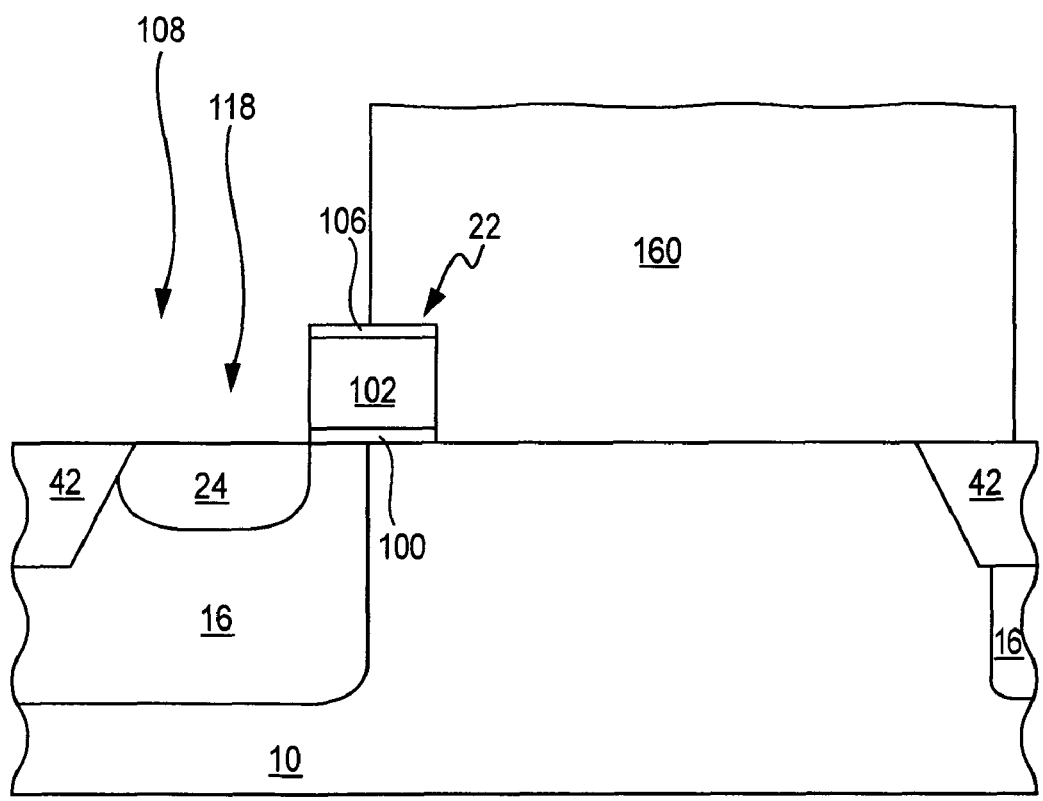
FIG. 11 shows a stage of fabrication of a circuit subsequent to that shown in FIG. 10.

Next, as shown in FIG. 11, transistor gates are formed, including the transfer gate 22 shown in FIGS. 1 and 2. Standard MOS gates are formed by forming a gate oxide layer 100 (e.g., silicon oxide) over the substrate 10, then forming a doped polysilicon layer 102 over the gate oxide layer 100 (the polysilicon layer can be doped in situ or subsequently implanted with a dopant), then forming an insulative cap layer 106 (e.g., oxide or nitride). These layers 100, 102, 106 are then masked, with patterned photoresist for example, and etched to leave stacks (which will become the transistor gates, including the transfer gate 22). In an alternative embodiment, a silicide layer 104 (shown in FIG. 2, but not in FIG. 11) can be formed over the polysilicon layer 102. However, omission of the silicide layer 104 is preferred. Additionally, a $V_t$ implant can be performed during processing as is known in the art.

After forming the gate stacks (e.g., transfer gate 22) a dopant implant 108 is performed in the substrate 10 to form a p-type region 16. A photoresist mask 160 prevents the implant 108 from doping the area of the pixel where the photodiode 14 will later be formed (see FIG. 2). As an alternative, the p-type region 16 may be formed by a blanket implant. Note, however, the dopant conductivity types utilized throughout processing can easily be reversed to form a PMOS type pixel structure, as opposed to an NMOS pixel.

After forming the p-type region 16, another implant 118 is used to form a floating diffusion region 24 adjacent the gate stack 22, as is known in the art (source/drain regions 23 for other transistors can be formed simultaneously at this time). The floating diffusion region 24 acts as a source/drain region of the transfer transistor. The floating diffusion region 24 implant 118 can be performed in the implant dose range of about $1 \times 10^{12}$ to about $2 \times 10^{16}$ ions/cm$^2$. In a preferred embodiment the implant dose range for this implant 118 is about $4 \times 10^{12}$ to about $2 \times 10^{15}$ ions/cm$^2$ and the floating diffusion region 24 is completed by diffusion.

Figure 12:
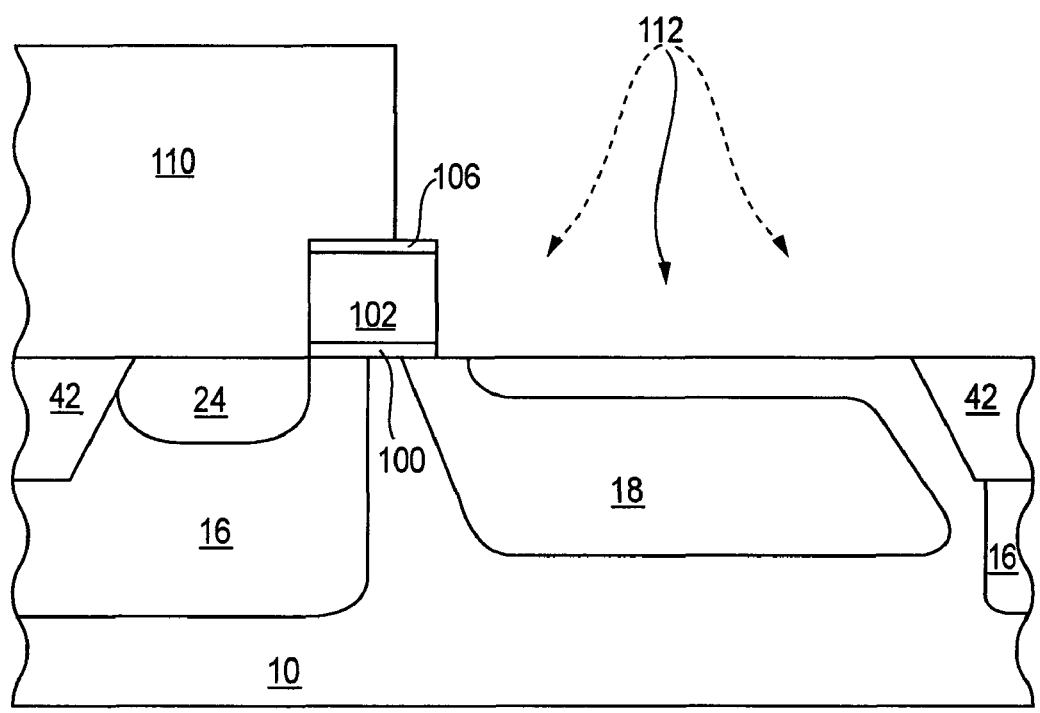
FIG. 12 shows a stage of fabrication of a circuit subsequent to that shown in FIG. 11.
Figure 13:
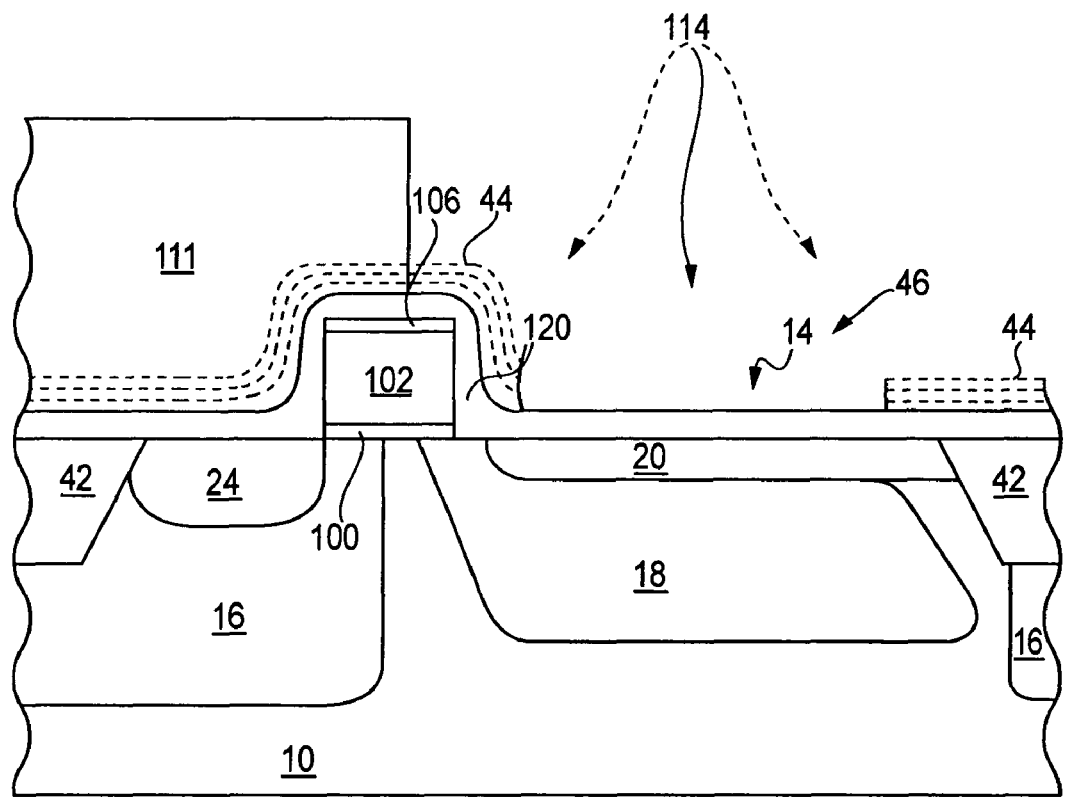
FIG. 13 shows a stage of fabrication of a circuit subsequent to that shown in FIG. 12.

The photodiode 14 (see FIG. 2) is a p-n-p structure including the underlying p-type substrate 10, an n-type region 18 within the p-type well 16, and a p-type layer 20 above the n-type region 18. The layers of the photodiode 14 (i.e., layers 10, 18, and 20) can be formed as shown in FIGS. 12 and 13. FIG. 12 shows the substrate 10 masked with a patterned photoresist 110 and another ion implantation 112 of a second conductivity type, here n-type, is performed. This forms an n-type region 18 in the active area of pixel 12 and below the transfer gate 22. An angled implant 112 can be utilized to form region 18 to achieve certain spatial characteristics of the photodiode 14.

As shown in FIG. 13, after removing the photoresist 110, an insulating layer 120 (TEOS) is formed over the transistor gate 22 (this same layer 120 can also form sidewall spacers for other transistor gates). The conformal multilayer light shield 44 of FIG. 3 can now be formed on the TEOS layer 120 by depositing alternating layers of tungsten and silicon nitride using processes know in the art. The opening 46 can be etched in the light shield layer 44, with TEOS layer 120 acting as an etch stop. Otherwise, or subsequent thereto, another mask of photoresist 111 is formed partially over the transistor gate 22 and a dopant implant 114 is performed to form a top p-type layer 20 of the photodiode 14. Optionally, an angled implant for implant 114 may be used as well.

Figure 14:
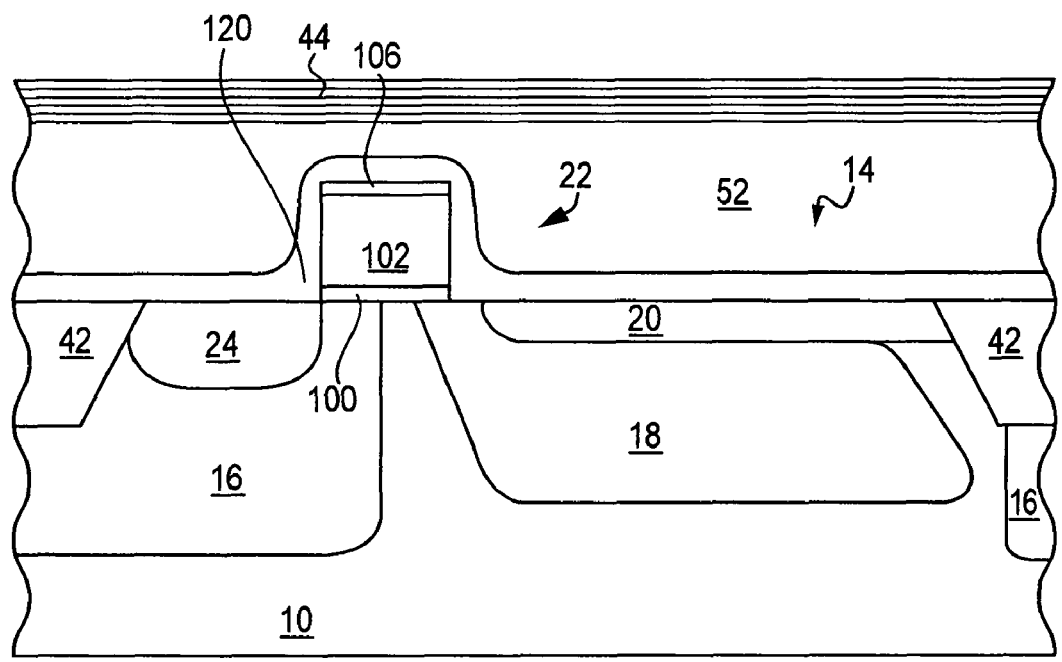
FIG. 14 shows a stage of fabrication of a circuit subsequent to that shown in FIG. 13.

As shown in FIG. 14, a dielectric layer 52 is deposited over the pixel 12 circuitry, including the transfer gate 22. (Dielectric layer 52 would be deposited over the alternative conformal light shield multilayer 44 shown in FIG. 13.) This dielectric layer 52 should be optically transparent so as not to impede light from reaching the photodiode 14. The dielectric layer 52 can comprise, e.g., silicon oxides or nitrides, glasses, or polymeric materials, and can be deposited by evaporative techniques, CVD, plasma enhanced chemical vapor deposition (PECVD), sputtering, or other techniques known in the art. The dielectric layer 52 may be planarized by various techniques, such as CMP or RIE etching. Alternatively, if a conformal dielectric layer is desired (see FIG. 3), the planarization step can be excluded.

The multilayer light shield 44 is formed over the dielectric layer 52 by depositing alternating layers of opaque or nearly opaque material, such as tungsten, and a transparent material, such as silicon nitride, as thin films. Such materials can be deposited on the dielectric layer 52 by conventional methods, such as by evaporation techniques, physical deposition, sputtering, CVD, etc. The light shield 44 can be a conformal layer (see FIG. 3) or a planar layer. The light shield 44 layers can be electrically conductive or electrically insulative. If formed of conductive material layers, the light shield 44 layer can be connected to a ground potential, thereby offering an electrical shield to protect the underlying circuitry from the overlying conductive interconnect, e.g., metallization, layers, which will be formed in subsequent steps. The light shield 44 is positioned relatively close to the underlying photodiode, as compared to those of the prior art formed in the M1 and/or M2 layers. Thus, the detrimental effects of crosstalk, light piping, and shadowing are mitigated.

Figure 15:
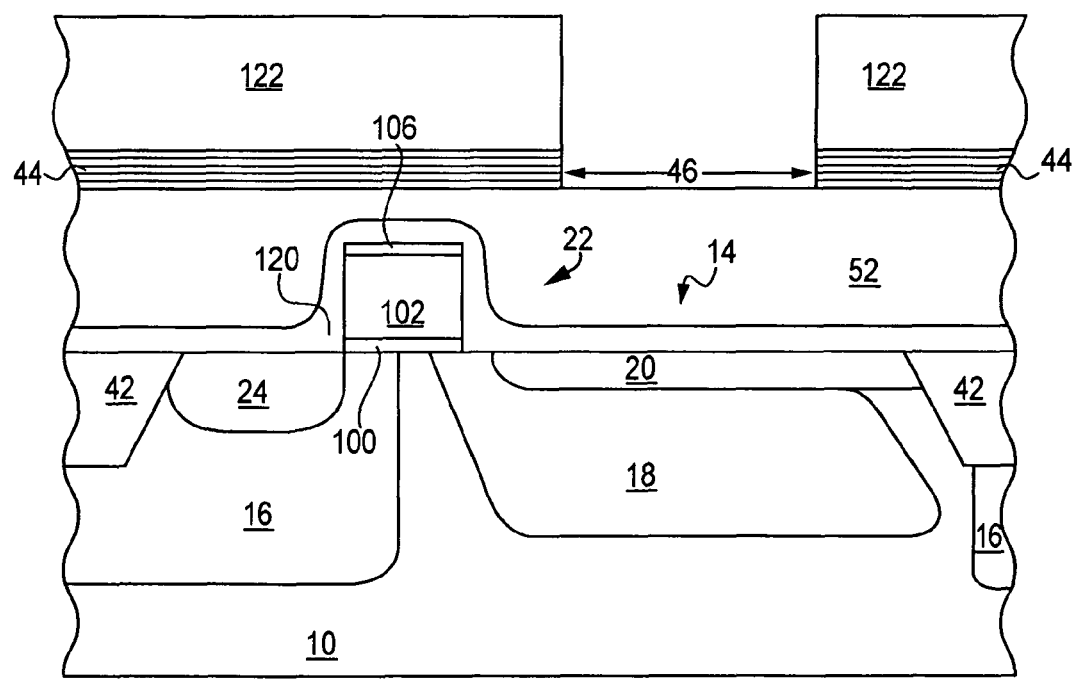
FIG. 15 shows a stage of fabrication of a circuit subsequent to that shown in FIG. 14.
Figure 16:
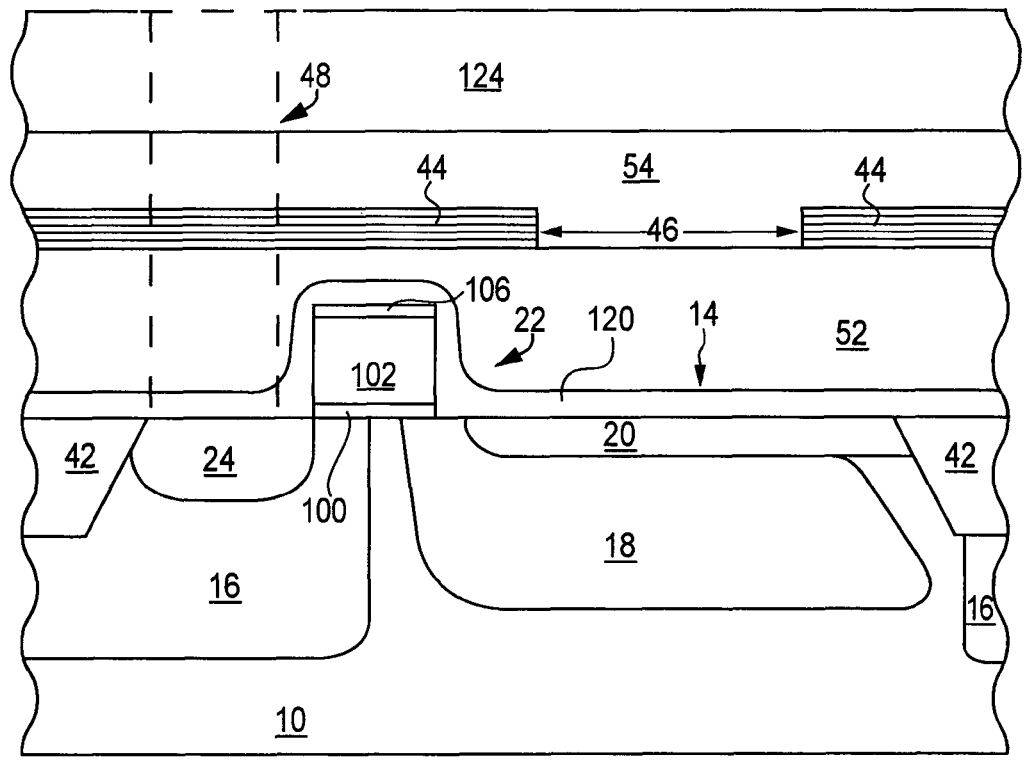
FIG. 16 shows a stage of fabrication of a circuit subsequent to that shown in FIG. 15.

Next, as shown in FIG. 15, a patterned photoresist mask 122 is formed over the light shield 44 layer. Subsequently, the multilayer light shield 44 is etched to form an aperture 46 over the photodiode 14. The dielectric layer 52 can serve as an etch stop. Then, as shown in FIG. 16, a second dielectric layer 54 is deposited over the light shield 44 and within the aperture 46 over the first dielectric layer 52. This dielectric layer 54 can be the same or similar in composition and light transmission and dielectric properties as the first dielectric layer 52 and can be deposited in a similar fashion. This second dielectric layer 54 can be planarized by CMP or RIE etching techniques, or alternatively, can be a conformal layer. A patterned photoresist 124 is formed over the second dielectric layer and the wafer is subsequently etched to form openings 48 through the two dielectric layers 52, 54 and the light shield 44 to expose the active areas in the substrate, including the floating diffusion region 24.

Figure 17:
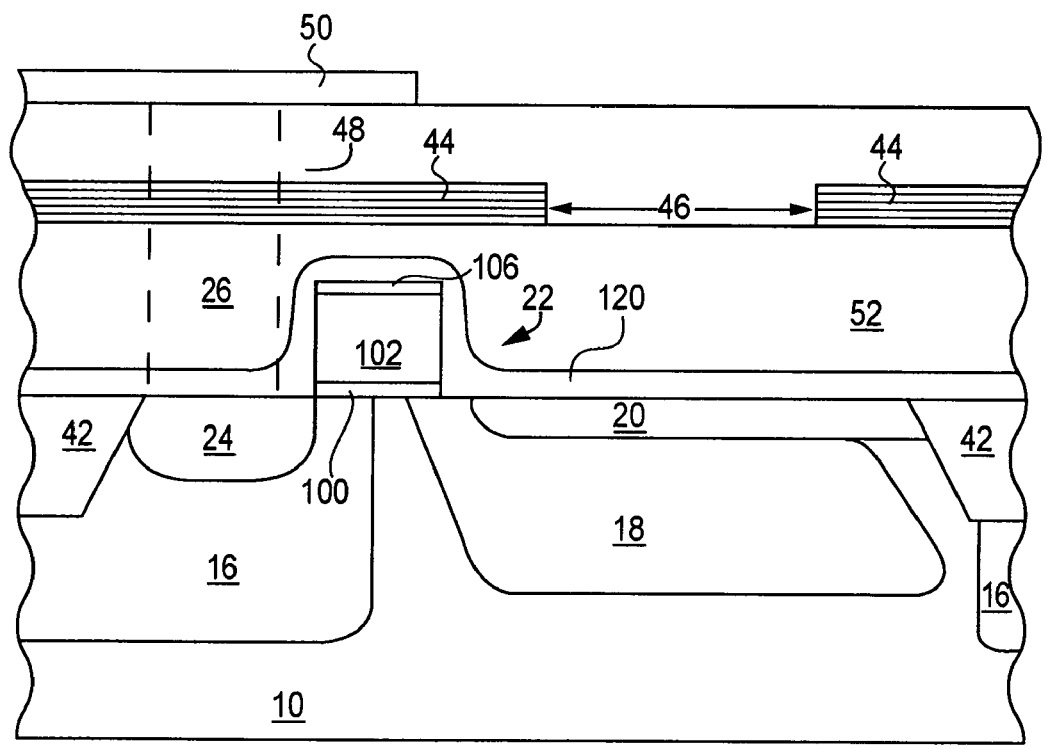
FIG. 17 shows a stage of fabrication of a circuit subsequent to that shown in FIG. 16.

Conductors are formed within the openings 48 as shown in FIG. 17. Optionally, a thin insulating layer (not shown) can be deposited within the openings 48 to electrically isolate the light shield 44, if conductive, from the conductors. One such conductor 26 is formed to connect the floating diffusion region 24. Over the second dielectric layer 54 and in electrical communication with conductor 26 a conductive interconnect layer 50, preferably of metal, is deposited to form an M1 layer. Preferably, the conductive interconnect layer 50 should not extend over the aperture 46 and photodiode 14 if composed of an opaque or translucent material. However, transparent or semi-transparent materials such as, e.g., polysilicon, can be used for the conductive interconnect layer 50, and if so they can overly the photodiode 14, if desired.

The floating diffusion region 24 is electrically connected with the source follower gate 32 through standard metallization steps, e.g., forming a conductor 26 to the floating diffusion region 24 and a conductor 34 (see FIG. 1) to the source follower gate, and forming a conductive interconnect 50 therebetween. Conductor 26 is in electrical communication with the M1 conductive interconnect layer 50 and there through with the source follower gate 32 and the rest of the integrated circuit, of which the pixel 12 is a part. Additional processing can follow, such as formation of an overlying dielectric layer 56 and a second conductive interconnect layer 60 (M2), as known in the art.

Figure 18:
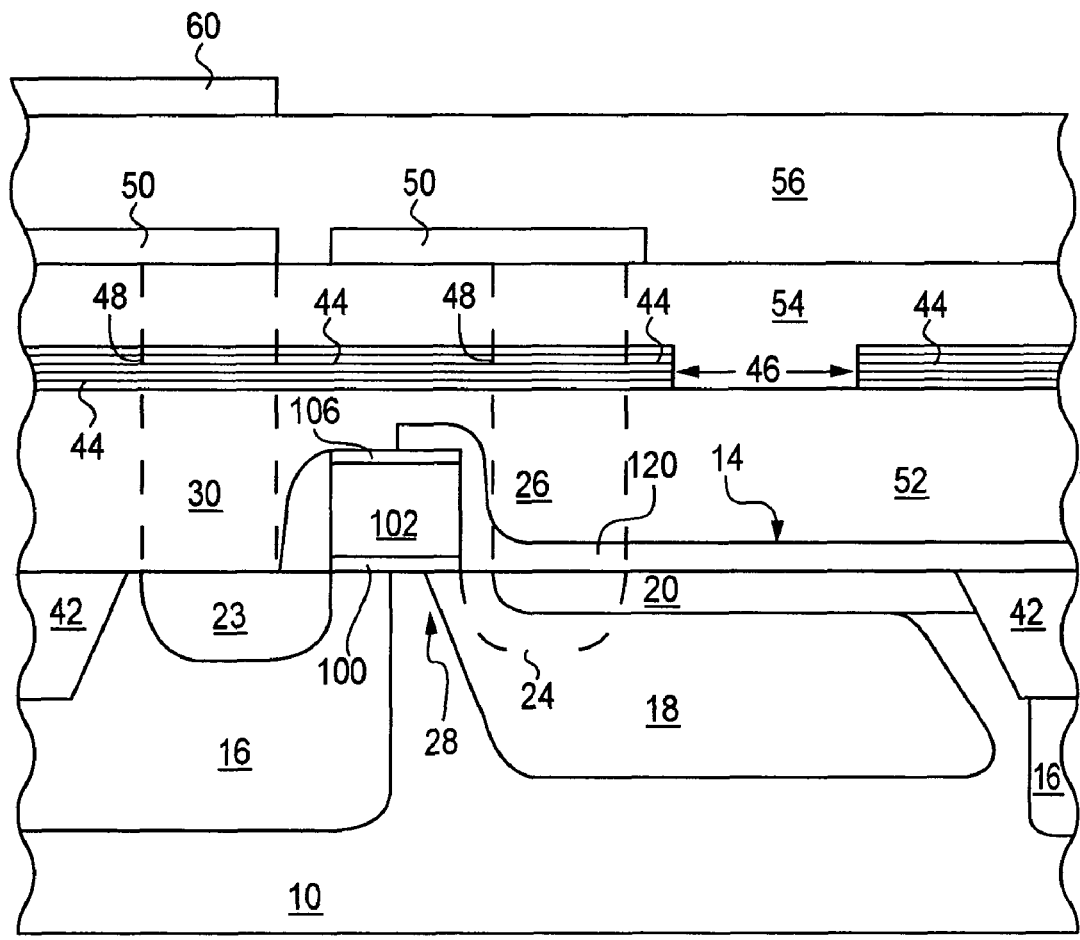
FIG. 18 shows a partial cross-sectional view of a 3T pixel similar to the 4T pixel shown in FIGS. 1 and 2 through the same cross-section portion of the pixel along line II-II of FIG. 1.

As indicated above, the light shield 44 of the invention is suitable for use with the circuitry of any CMOS pixel, no matter how many transistors are used in the pixel circuit. FIG. 18 shows a cross-section of a 3T pixel 12, which is similar in most ways to the 4T circuit discussed above, but differs in that the transfer gate 22 is removed. The photodiode 14 is electrically linked directly with the source follower gate 32 through the floating diffusion region 24 and conductor 26, the M1 conductive interconnect layer 50, and conductor 34. No transfer transistor is needed to gate charges generated at the photodiode 14 since the floating diffusion region 24 is in direct electrical contact with the photodiode 14. However, the reset gate 28 is still provided and is electrically connected to a voltage source ($V_{dd}$) via contact 30 and part of the conductive path 50.

Figure 19:
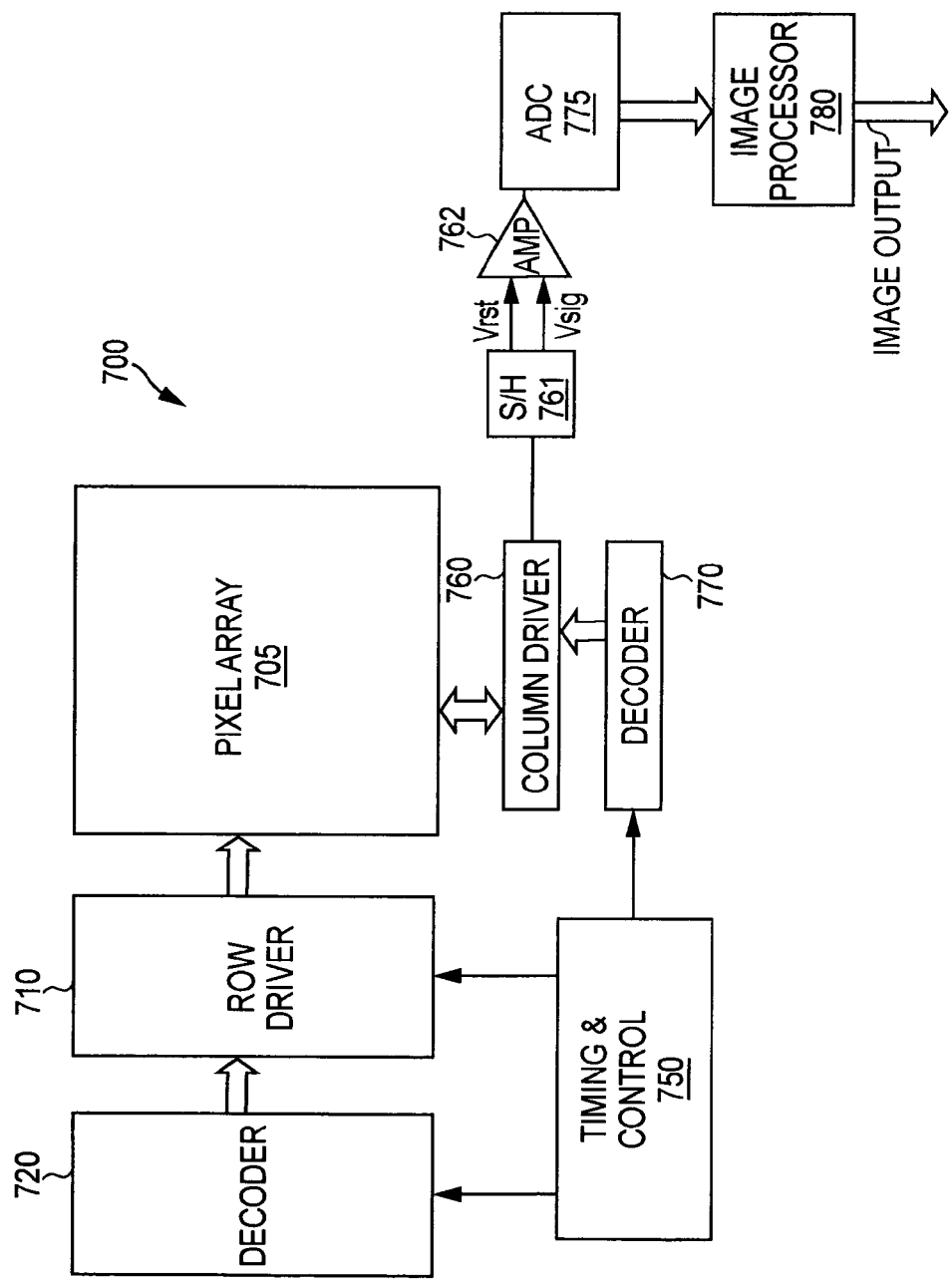
FIG. 19 shows a pixel array integrated into a CMOS imager system in accordance with the invention.

FIG. 19 illustrates an exemplary imaging device 700 that may utilize pixels 12 including light shielding constructed in accordance with the invention. The imaging device 700 has an imager pixel array 705 comprising pixels with light shields constructed as described above with reference to FIGS. 1-18. Row lines are selectively activated by a row driver 710 in response to row address decoder 720. A column driver 760 and column address decoder 770 are also included in the imaging device 700. The imaging device 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst–Vsig) is produced by differential amplifier 762 for each pixel and is digitized by analog-to-digital converter 775 (ADC). The analog-to-digital converter 775 supplies the digitized pixel signals to an image processor 780 which forms and outputs a digital image.

Figure 21:
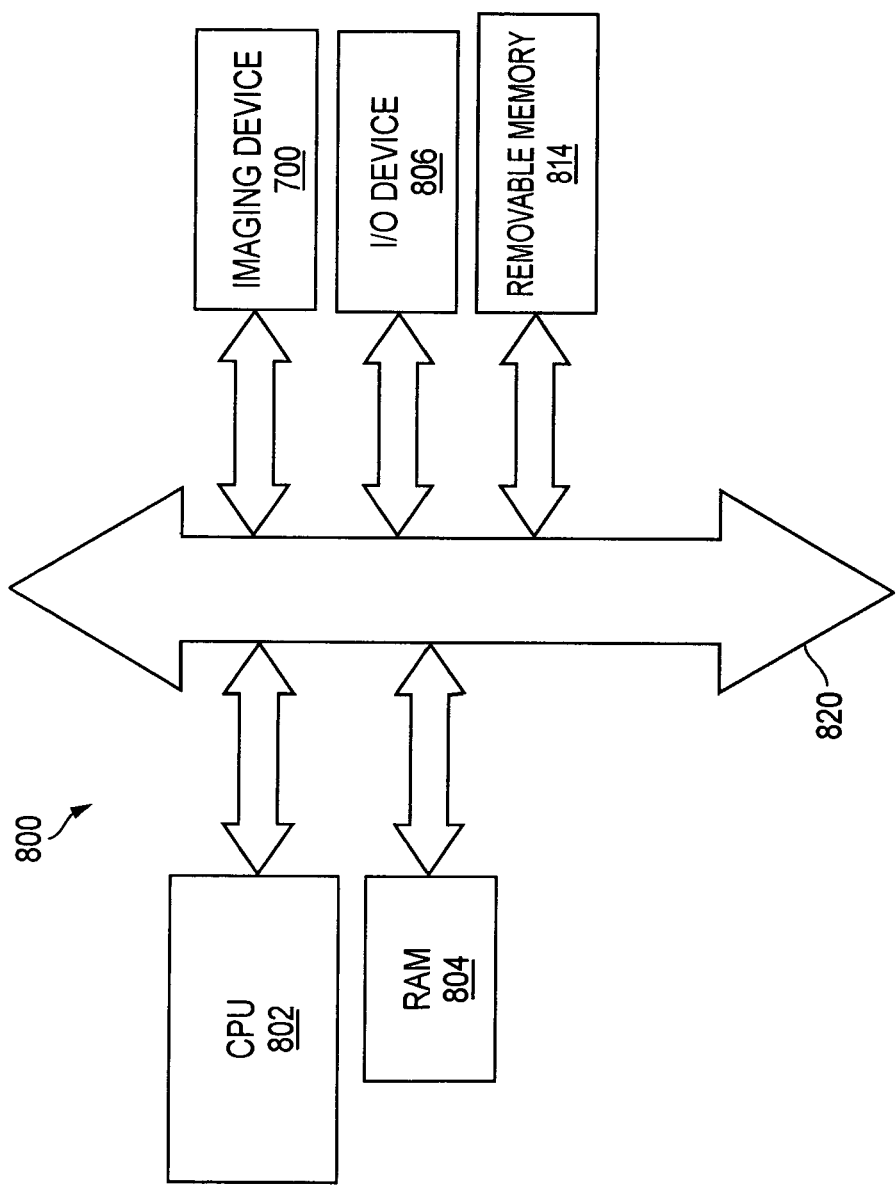
FIG. 21 shows a processor system incorporating at least one CMOS imaging device, constructed in accordance with the invention.

FIG. 21 shows system 800, a typical processor system modified to include the imaging device 700 (FIG. 19) of the invention. The processor-based system 800 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and data compression system.

System 800, for example a camera system, generally comprises a central processing unit (CPU) 802, such as a microprocessor, that communicates with an input/output (I/O) device 806 over a bus 820. Imaging device 700 also communicates with the CPU 802 over the bus 820. The processor-based system 800 also includes random access memory (RAM) 804, and can include removable memory 814, such as flash memory, which also communicate with the CPU 802 over the bus 820. The imaging device 700 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letter Patent of the United States is:

1. A method of forming a CMOS imager pixel comprising:
   forming a photoconversion device in a substrate;
   forming a light shield over the substrate except over a substantial portion of an uppermost conductivity layer of the photoconversion device, the light shield comprising a plurality of layers; and
   forming at least one opening in the light shield and forming an electrical conductor therein.

2. The method according to claim 1, wherein the step of forming the photoconversion device further comprises:
   forming a first doped layer of a first conductivity type in the substrate by implanting ions of the first conductivity type using angled ion implantation; and
   forming a doped region of a second conductivity type in the substrate and below the first doped layer by implanting ions of the second conductivity type using angled ion implantation.

3. The method of claim 2, wherein the first conductivity type and the second conductivity type are p-type and n-type, respectively.

4. The method of claim 1, wherein the plurality of layers include layers of light-shielding material separated by respective layers of dielectric material.

5. The method of claim 4, wherein the light shielding material comprises a refractory metal.

6. The method of claim 4, wherein the dielectric material comprises one of silicon nitride and silicon oxide.

7. The method according to claim 4, wherein at least one of the layers of dielectric material has a thickness of about 100 Å to about 1,000 Å thick.

8. The method according to claim 4, wherein at least one of the layers of dielectric material has a thickness of about ¼ wavelength of incident light to be blocked by the light shield.

9. A CMOS imaging circuit having at least one CMOS imager pixel comprising:
   a photoconversion device within a semiconductor substrate;
   a light-blocking film over the substrate and the photoconversion device, the light-blocking film comprising stacked layers of at least one layer of a light-shielding material and at least one layer of a light-transmissive material, and the light-blocking film being formed over the substrate except over a substantial portion of a top surface of the photoconversion device and the light-blocking film having openings configured to allow conductors to pass therethrough;

a transfer transistor, the transfer transistor comprising a transfer gate with a first side and a second side opposite the first side, the transfer gate being associated with the photoconversion device at the first side of the transfer gate and with a floating diffusion region at the second side; and a reset transistor having one side associated with the floating diffusion region.

10. The CMOS imaging circuit of claim 9, comprising a plurality of layers of light-shielding material, wherein the layers of light-shielding material are separated by a distance equal to about ¼ wavelength of light to be detected by the CMOS imager pixel.

11. The CMOS imaging circuit of claim 9, wherein the light-blocking film is located at least within about 3,000 Å about 4,000 Å of a pixel surface.

12. The CMOS imaging circuit of claim 9, wherein the light-shielding material comprises a metal having a melting point greater than about 1,000° C.

13. A CMOS imager pixel having a photoconversion device comprising:

a light shield provided above the photoconversion device and having a light transmission area over the photoconversion device, the light shield comprising alternating layers of tungsten and silicon nitride, and the light shield being formed over the photoconversion device except over a substantial portion of a surface layer of the photoconversion device and the light shield having openings configured to allow conductors to pass therethrough.

14. The CMOS imager pixel of claim 13, wherein the alternating layers include two layers of tungsten and two layers of silicon nitride.

15. The CMOS imager pixel of claim 14, wherein the tungsten layers are each about 840 Å thick.

16. The CMOS imager pixel of claim 14, wherein the silicon nitride layers are each about 600 Å thick.

17. The CMOS imager pixel of claim 13, wherein the alternating layers include three layers of tungsten and three layers of silicon nitride.

18. The CMOS imager pixel of claim 17, wherein the tungsten layers are each about 560 Å thick.

19. The CMOS imager pixel of claim 17, wherein the silicon nitride layers are each about 600 Å thick.

* * * * *